United States Patent
Syracuse et al.

(10) Patent No.: US 7,092,830 B2
(45) Date of Patent: Aug. 15, 2006

(54) METHOD FOR ESTIMATING LONG TERM END-OF-LIFE CHARACTERISTICS USING SHORT-TERM DATA FOR LITHIUM/SILVER VANADIUM OXIDE CELLS

(75) Inventors: Kenneth Syracuse, Clarence Center, NY (US); Noelle Waite, Clarence Center, NY (US); Hong Gan, Williamsville, NY (US); Esther S. Takeuchi, East Amherst, NY (US)

(73) Assignee: Wilson Greatbatch Technologies, Inc., Clarence, NY (US)

( * ) Notice: Subject to any disclaimer, the term of this patent is extended or adjusted under 35 U.S.C. 154(b) by 0 days.

(21) Appl. No.: 11/087,302

(22) Filed: Mar. 23, 2005

(65) Prior Publication Data

US 2005/0216212 A1    Sep. 29, 2005

Related U.S. Application Data

(60) Provisional application No. 60/555,538, filed on Mar. 23, 2004.

(51) Int. Cl.
*G01R 31/36* (2006.01)
(52) U.S. Cl. .......................... 702/63; 320/132; 607/29
(58) Field of Classification Search ................ 702/63; 320/132; 607/29
See application file for complete search history.

(56) References Cited

U.S. PATENT DOCUMENTS

| | | | |
|---|---|---|---|
| 4,259,639 A | 3/1981 | Renirie | |
| 4,743,855 A | 5/1988 | Randin et al. | |
| 4,830,940 A | 5/1989 | Keister et al. | |
| 4,964,877 A | 10/1990 | Keister et al. | |
| 5,241,275 A | 8/1993 | Fang | |
| 5,369,364 A | 11/1994 | Renirie et al. | |
| 5,391,193 A | 2/1995 | Thompson | |
| 5,435,874 A | 7/1995 | Takeuchi et al. | |
| 5,527,630 A | 6/1996 | Nagata et al. | |
| 5,571,640 A | 11/1996 | Takeuchi et al. | |
| 6,166,524 A * | 12/2000 | Takeuchi et al. | 320/132 |
| 6,167,309 A | 12/2000 | Lyden | |
| 6,307,378 B1 | 10/2001 | Kozlowski | |
| 6,639,386 B1 | 10/2003 | Shiojima | |
| 6,820,019 B1 * | 11/2004 | Kelly et al. | 702/63 |
| 6,940,255 B1 * | 9/2005 | Loch | 320/132 |
| 2004/0039424 A1 * | 2/2004 | Merritt et al. | 607/29 |
| 2004/0051504 A1 | 3/2004 | Syracuse et al. | |

* cited by examiner

*Primary Examiner*—Marc S. Hoff
*Assistant Examiner*—Janet L Suglo
(74) *Attorney, Agent, or Firm*—Michael F. Scalise

(57) ABSTRACT

The present invention is directed to a method for analyzing the tail-end behavior of a lithium cell having a solid cathode. The tail of a longer-term accelerated discharge data (ADD) test is estimated from the tail of two shorter-term ADD tests. This is accomplished by first comparing the discharge tails of shorter-term ADD tests and determining angles or rotation that correspond to Rdc growth, and then trending rotation angles versus time to reach a give DoD. For example, the 18-month and 36-month ADD test tails are used to estimate the ADD test tail of a similarly constructed cell subjected to a longer-term ADD test, for example a 48-month ADD test.

15 Claims, 2 Drawing Sheets

METHOD FOR ESTIMATING LONG TERM END-OF-LIFE CHARACTERISTICS USING SHORT-TERM DATA FOR LITHIUM/SILVER VANADIUM OXIDE CELLS

CROSS-REFERENCE TO RELATED APPLICATION

This application claims priority based on provisional application Ser. No. 60/555,538, filed Mar. 23, 2004.

BACKGROUND OF INVENTION

The present invention generally relates to the conversion of chemical energy to electrical energy. More particularly, this invention relates to a method for estimating the discharge curve of an electrochemical cell having a lithium anode and a solid cathode. A preferred couple is a lithium/silver vanadium oxide (Li/SVO) cell. In such cells, it is desirable to accurately estimate the shape of the discharge curve, especially in the cell's latter stages of life, from the discharge curves of other similarly constructed cells subjected to varied accelerated discharge protocols.

In implantable medical device applications, it is important to accurately predict when the power source will reach its end of life. For patient safety, doctors need to have this information several months before the power source reaches the end of its service life. This gives them time to schedule the patient for replacement of the implantable device. In that respect, the Li/SVO cell system is typically used as the power source for implantable cardiac defibrillator applications requiring high rate pulse capability, i.e., about 1 to about 5 amps. Due to the characteristic voltage delay and Rdc growth that occurs at about the 2.6-volt plateau, a pre-determined Rdc or voltage value under high current pulsing is sometimes used as an elective replacement indicator (ERI). This pre-determined voltage value varies depending on the cell size, theoretical capacity and the associated device design. Consequently, selection of the ERI reading is very complicated and dependent on the individual device design of each manufacturer.

For that reason, the present method enables the designer of an implantable medical device to accurately predict the shape of a cell's discharge curve, especially during latter stages of its life, from similarly constructed cells discharged under relatively rapid discharge regimes. This helps the designer know when a power cell model is approaching its end of life under varied usages. The device electronics can then be programmed to trigger when a pre-determined Rdc or current pulse voltage has been reached as the elective replacement indicator.

SUMMARY OF THE INVENTION

The present invention is directed to estimating the tail of a cell subjected to a longer-term accelerated discharge data (ADD) test using the tails of two comparatively shorter-term accelerated tests. For example, the tails of two Li/SVO cells, one subjected to an 18-month ADD discharge test and the other to a 36-month ADD test are used to estimate what the discharge curve for a similarly constructed cell discharged under a third, longer ADD test, for example a 48-month or a 60-month ADD test, will look like. This is accomplished by first comparing the discharge tails of shorter-term ADD tests and determining angles of rotation that correspond to Rdc growth, and then trending rotation angles versus time to reach a given DoD.

These and other objects of the present invention will become increasingly more apparent to those skilled in the art by reference to the following description and to the appended drawings.

DETAILED DESCRIPTION OF THE PREFERRED EMBODIMENTS

Figure 1:
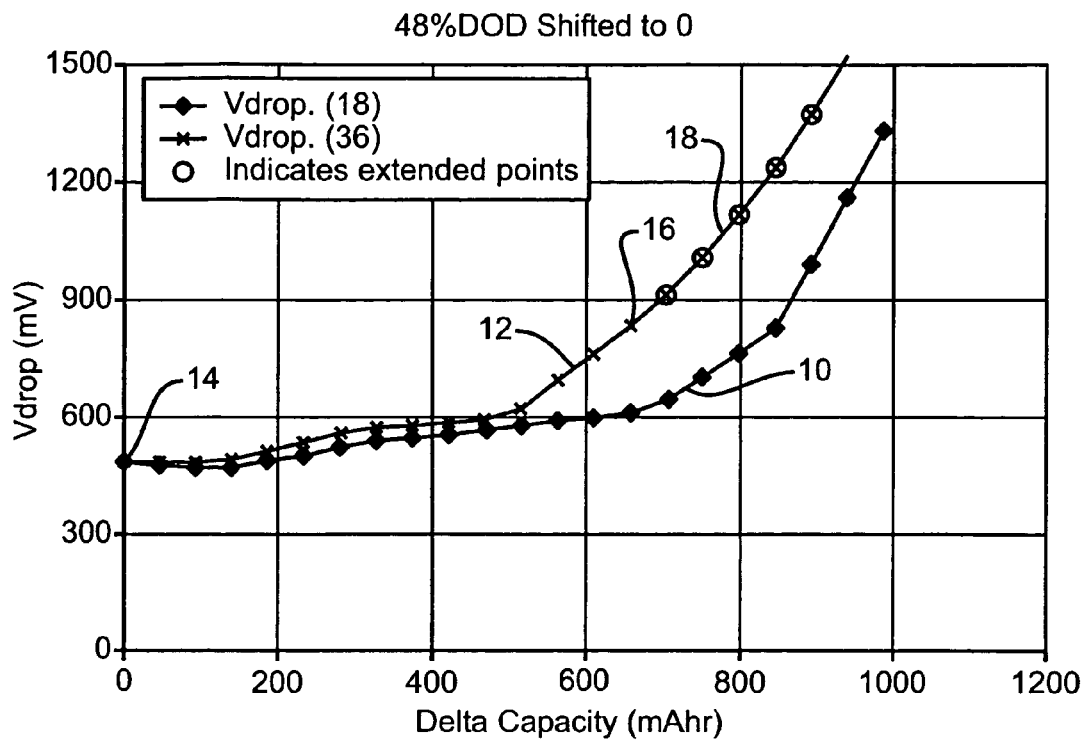
FIG. 1 is a graph of two Li/SVO cells discharged under 18-month and 36-month ADD regimes, respectively.

The term percent depth-of-discharge (% DoD) is defined as the ratio of delivered capacity to theoretical capacity, times 100.

The term "total time on test" (TToT) is defined as the total computed length of time to reach 100% DoD.

The term "pulse" means a short burst of electrical current of significantly greater amplitude than that of a pre-pulse current or open circuit voltage immediately prior to the pulse. A pulse train consists of at least one pulse of electrical current. The pulse is designed to deliver energy, power or current. If the pulse train consists of more than one pulse, they are delivered in relatively short succession with or without open circuit rest between the pulses. An exemplary pulse train may consist of one to four 5 to 20-second pulses (23.2 mA/cm$^2$) with about a 10 to 30 second rest, preferably about 15 second rest, between each pulse. A typically used range of current densities for cells powering implantable medical devices is from about 15 mA/cm$^2$ to about 50 mA/cm$^2$, and more preferably from about 18 mA/cm$^2$ to about 35 mA/cm$^2$. Typically, a 10 second pulse is suitable for medical implantable applications. However, it could be significantly shorter or longer depending on the specific cell design and chemistry and the associated device energy requirements. Current densities are based on square centimeters of the cathode electrode.

The term "first shorter-term ADD test" refers to a first cell subjected to an ADD test regime having a shortest TToT.

The term "second shorter-term ADD test" refers to a second cell subjected to an ADD test regime having a somewhat longer TToT than that of the first shorter-term ADD test.

The term "longer-term ADD test" refers to a third cell subjected to an ADD test regime having a longer TToT than that of either the first or second shorter-term ADD tests.

An electrochemical cell that possesses sufficient energy density and discharge capacity required to meet the vigorous requirements of implantable medical devices comprises an anode of lithium and its intermetallic compounds including, for example, Li—Si, Li—Al, Li—B and Li—Si—B alloys. Lithium metal is preferred although a lithium-aluminum alloy is frequently used for short circuit safety considerations. The greater the amounts of aluminum present by weight in the alloy the higher the anode melting temperature, however, the lower the energy density of the cell.

The form of the anode may vary, but preferably the anode is a thin metal sheet or foil of the anode metal, pressed or rolled on a metallic anode current collector, i.e., preferably comprising titanium, titanium alloy or nickel, to form an anode component. Copper, tungsten and tantalum are also suitable materials for the anode current collector. The anode current collector has an extending tab or lead integrally formed therewith and contacted by a weld to a cell case of conductive metal in a case-negative electrical configuration. Alternatively, the anode may be formed in some other geometry, such as a bobbin shape, cylinder or pellet to allow an alternate low surface cell design.

The electrochemical cell of the present invention further comprises a cathode of electrically conductive material that serves as the counter electrode. The cathode is preferably of solid materials having the general formula $SMxV_2O_y$, where SM is a metal selected from Groups IB to VIIB and VIII of the Periodic Table of Elements, and wherein x is about 0.30 to 2.0 and y is about 4.5 to 6.0 in the general formula. By way of illustration, and in no way intended to be limiting, one exemplary cathode active material comprises silver vanadium oxide having the general formula $Ag_xV_2O_y$, in either its β-phase having x=0.35 and y=5.8, γ-phase having x=0.74 and y=5.37, or ε-phase having x=1.0 and y=5.5, and combinations of phases thereof.

Other cathode active materials useful with the present invention include copper silver vanadium oxide, manganese dioxide, titanium disulfide, copper oxide, copper sulfide, iron sulfide, iron disulfide, cobalt oxide, nickel oxide, copper vanadium oxide, $LiNiO_2$, $LiMn_2O_4$, $LiCoO_2$, $LiCo_{0.92}Sn_{0.08}O_2$, $LiCo_{1-x}Ni_xO_2$, and combinations thereof.

Before fabrication into an electrode for incorporation into an electrochemical cell, the cathode active material is preferably mixed with a binder material such as a powdered fluoro-polymer, more preferably powdered polytetrafluoroethylene or powdered polyvinylidene fluoride present at about 1 to about 5 weight percent of the cathode mixture. Further, up to about 10 weight percent of a conductive diluent is preferably added to the cathode mixture to improve conductivity. Suitable materials for this purpose include acetylene black, carbon black and/or graphite or a metallic powder such as powdered nickel, aluminum, titanium, stainless steel, and mixtures thereof. The preferred cathode active mixture thus includes a powdered fluoropolymer binder present at a quantity of at least about 3 weight percent, a conductive diluent present at a quantity of at least about 3 weight percent and from about 80 to about 99 weight percent of the cathode active material.

Cathode components for incorporation into the cell may be prepared by rolling, spreading or pressing the cathode active mixture onto a suitable current collector selected from the group consisting of stainless steel, titanium, tantalum, platinum, nickel, and gold. Cathodes prepared as described above may be in the form of one or more plates operatively associated with at least one or more plates of anode material, or in the form of a strip wound with a corresponding strip of anode material in a structure similar to a "jellyroll".

In order to prevent internal short circuit conditions, the cathode is separated from the anode material by a suitable separator material. The separator is of electrically insulative material, and the separator material also is chemically unreactive with the anode and cathode active materials and both chemically unreactive with and insoluble in the electrolyte. In addition, the separator material has a degree of porosity sufficient to allow flow there through of the electrolyte during electrochemical reactions of the cell. Illustrative separator materials include fabrics woven from fluoropolymeric fibers including polyvinylidine fluoride, polyethylenetetrafluoroethylene, and polyethylenechlorotrifluoroethylene used either alone or laminated with a fluoropolymeric microporous film, non-woven glass, polypropylene, polyethylene, glass fiber materials, ceramics, polytetrafluoroethylene membrane commercially available under the designation ZITEX (Chemplast Inc.), polypropylene membrane commercially available under the designation CELGARD (Celanese Plastic Company, Inc.), a membrane commercially available under the designation DEXIGLAS (C. H. Dexter, Div., Dexter Corp.), and a membrane commercially available under the designation TONEN.

The electrochemical cell further includes a nonaqueous, ionically conductive electrolyte serving as a medium for migration of ions between the anode and the cathode electrodes during electrochemical reactions of the cell. The electrochemical reaction at the electrodes involves conversion of ions in atomic or molecular forms that migrate from the anode to the cathode. Thus, suitable nonaqueous electrolytes are substantially inert to the anode and cathode materials, and they exhibit those physical properties necessary for ionic transport, namely, low viscosity, low surface tension and wettability.

A suitable electrolyte has an inorganic, ionically conductive salt dissolved in a mixture of aprotic organic solvents comprising a low viscosity solvent and a high permittivity solvent. In the case of an anode comprising lithium, preferred lithium salts include $LiPF_6$, $LiBF_4$, $LiAsF_6$, $LiSbF_6$, $LiClO_4$, $LiO_2$, $LiAlCl_4$, $LiGaCl_4$, $LiC(SO_2CF_3)_3$, $LiN(SO_2CF_3)_2$, $LiSCN$, $LiO_3SCF_3$, $LiC_6F_5SO_3$, $LiO_2CCF_3$, $LiSO_6F$, $LiB(C_6H_5)_4$, $LiCF_3SO_3$, and mixtures thereof.

Low viscosity solvents useful with the present invention include esters, linear and cyclic ethers and dialkyl carbonates such as tetrahydrofuran, methyl acetate, diglyme, trigylme, tetragylme, dimethyl carbonate, 1,2-dimethoxyethane, 1,2-diethoxyethane, 1-ethoxy,2-methoxyethane, ethyl methyl carbonate, methyl propyl carbonate, ethyl propyl carbonate, diethyl carbonate, dipropyl carbonate, and mixtures thereof. High permittivity solvents include cyclic carbonates, cyclic esters and cyclic amides such as propylene carbonate, ethylene carbonate, butylene carbonate, acetonitrile, dimethyl sulfoxide, dimethyl formamide, dimethyl acetamide, γ-valerolactone, γ-butyrolactone, N-methyl-2-pyrrolidone, and mixtures thereof. In a lithium/silver vanadium oxide cell, the preferred electrolyte is 0.8M to 1.5M $LiAsF_6$ or $LiPF_6$ dissolved in a 50:50 mixture, by volume, of propylene carbonate and 1,2-dimethoxyethane.

The preferred form of the electrochemical cell is a case-negative design wherein the anode/cathode couple is inserted into a conductive metal casing connected to the anode current collector, as is well known to those skilled in the art. A preferred material for the casing is stainless steel, although titanium, mild steel, nickel, nickel-plated mild steel and aluminum are also suitable. The casing header comprises a metallic lid having a sufficient number of openings to accommodate the glass-to-metal seal/terminal pin feedthrough for the cathode. The anode is preferably connected to the case or the lid. An additional opening is provided for electrolyte filling. The casing header comprises elements having compatibility with the other components of the electrochemical cell and is resistant to corrosion. The cell is thereafter filled with the electrolyte solution described hereinabove and hermetically sealed such as by close-welding a stainless steel plug over the fill hole, but not limited thereto. The cell of the present invention can also be constructed in a case-positive design.

A cardiac defibrillator requires a power source for a generally medium rate, constant resistance load component provided by circuits performing such functions as, for example, the heart sensing and pacing functions. This requires electrical current of about 1 microampere to about 100 milliamperes. From time-to-time, the cardiac defibrillator may require a generally high rate, pulse discharge load component that occurs, for example, during charging of a capacitor in the defibrillator for the purpose of delivering an electrical shock therapy to the heart to treat tachyarrhythmias, the irregular, rapid heartbeats that can be fatal if left uncorrected. This requires electrical current of about 1 ampere to about 5 amperes. A Li/SVO cell is uniquely qualified to deliver the relatively low currents needed for the heart sensing and pacing functions as well as the high rate current requirements during device activation.

In order to test Li/SVO cells for their electrochemical characteristics, several accelerated discharge regimes are commonly used in the industry. One consists of discharging a Li/SVO cell under a 17.4 kΩ load with superimposed pulse trains applied every 60 days. The pulse trains consist of four 2.0 amp pulses of constant current, each of 10-second duration with about 15 seconds rest between each pulse. One such pulse train is superimposed on the background load about every 2 months. This type of discharge is termed 1 year accelerated discharge data (1-year ADD). Table 1 lists other industry recognized ADD tests along with the interval between each pulse train and the typical TToT to 100% DoD. The year ADD tests are for discharging a cell to 70% DoD while the month ADD tests are designed to discharge a cell to 100% DoD. In all cases, the pulse applicable tests are performed at 37° C. Accelerated discharge tests well recognized in the industry are also performed at 50° C., but their pulse intervals are different than those indicated below.

TABLE 1

| Test Type | Pulse Interval | TToT (to 100% DoD) |
| --- | --- | --- |
| 1-year ADD | 56 days | 18 months |
| 3-year ADD | 112 days | 52 months |
| 5-year ADD | 183 days | 85 months |
| 18-month ADD | 45 days | 18 months |
| 36-month ADD | 91 days | 36 months |
| 48-month ADD | 121 days | 48 months |
| 60-month ADD | 150 days | 60 months |

One issue relative to a Li/SVO cell is the existence of voltage delay and permanent Rdc growth. While not entirely unique to a Li/SVO cell, voltage delay is a phenomenon that can occur during the application of a short duration electrical pulse or during a pulse train discharge. It is believed to be associated with anode surface film formation and is influenced by the manner the cell is discharged and its discharge state in terms of percent depth-of-discharge. Voltage delay manifests itself in two forms. One is where the leading edge potential of the first pulse ($P1_{min}$ or P1M) is lower than the end edge potential of the first pulse ($P1_{last}$ or P1L). In other words, the cell voltage at the instant a first pulse is applied is lower than the cell voltage immediately before the first pulse is removed. The second form is when the minimum potential of the first pulse is lower than the minimum potential of the last pulse when a series of pulses or a pulse train is applied.

The discharge life of a Li/SVO cell can be divided into three regions that are primarily dictated by the occurrence of voltage delay and the growth of permanent Rdc during pulse discharge. In order to standardize what is meant by these regions, the following definitions apply: the first region is the period where the cell experiences reversible Rdc growth, which extends from beginning of life to the initial separation point between $Vdrop.P1_{min}$ (P1M) and $Vdrop.P1_{last}$ (P1L). Voltage drop is the difference between the background voltage and loaded voltage (BV−PV). The second region is the period of discharge where the cell experiences irreversible Rdc growth and voltage delay. This region covers the range from the initial separation of P1M and P1L (end of the first region) to the point where P1M and P1L become coincident again (beginning of the third region). The third region is where the cell experiences marginal irreversible Rdc growth with the P1M and P1L voltage drops being essentially coincident. The exact beginning and end of the second region and, consequently, the end of the first region and the beginning of the third region, is, however, dictated by the cathode type being of either a pressed powder design as described in U.S. Pat. Nos. 4,830,940 and 4,964,877, both to Keister et al. or of a freestanding sheet of SVO as described in U.S. Pat. Nos. 5,435,874 and 5,571,640, both to Takeuchi et al. These patents are assigned to the assignee of the present invention and incorporated herein by reference.

For a pressed powder SVO cathode, the first region ranges from beginning of life to about 35% DoD where voltage delay and irreversible Rdc growth are not significant. The second region ranges from about 35% DoD to about 60% DoD. The third region ranges from about 60% DoD to end of life and is where voltage delay and irreversible Rdc growth are significantly reduced, if not entirely absent again. On the other hand, for a freestanding SVO sheet cathode, the first region ranges from beginning of life to about 25% DoD, the second region ranges from about 25% DoD to about 45% DoD and the third region ranges from about 45% DoD to end of life. A method for determining the exact onset and end of voltage delay and irreversible Rdc growth region demarcating the beginning and end of the second region in a Li/SVO cell is described in U.S. Patent Application Publication No. 2004/0051504 to Syracuse et al. This application is assigned to the assignee of the present invention and incorporated herein by reference.

Another important issue applicable to any power source is to accurately understand the shape of the discharge curve under accelerated discharge tests of varied durations. This is especially important for an implantable power source so that elective surgery can be safely performed for device replacement before the cell reaches its discharge end-of-life. For a cell undergoing a relatively long-term accelerated discharge test (longer-term ADD test), it is desirable to predict the shape of later stages of its discharge curve from the known discharge curves for two cells of similar chemistry subjected to shorter duration accelerated discharge regimes (first and second shorter-term ADD tests).

The first step is to determine the starting point of the "tail". The discharge curve "tail" is defined as beginning at the start of the third region, which, as previously described, is a function of the cathode type and test length. Since longer test lengths are of primary interest, selecting the beginning of the third region as the beginning of the analyses mitigates the influence of voltage drop.

There are two main points that need to be assessed. The first is the magnitude of the offset, or delta. That is the amount that is added to the first shorter-term ADD test curve to enable it to join to the second shorter-term ADD test curve at the beginning of the third region. The second is to assess the Rdc rise of the second shorter-term tail relative to the first shorter-term ADD test tail. When the first shorter-term ADD test tail is added to the longer-term ADD test curve, the implicit assumption is that the shape and rate of Rdc growth are the same for both the first and second shorter-term ADD tests and the longer-term ADD test up to the point of incorporating self-discharge, i.e. at the beginning of the third region. Accounting for self-discharge has the effect of rotating the tails of the two shorter-term ADD test curves in a counterclockwise manner.

In that respect, the second shorter-term ADD test curve is constructed by first fixing the beginning of its third region point to correspond with the beginning of the third region point for the first shorter-term ADD test curve and then rotating, or sweeping, the first shorter-term test tail counterclockwise through the change in angle attendant to the rate of Rdc growth. This counterclockwise rotational angle corresponding to the rate of Rdc growth is then useful for estimating the tail for the discharge of a third cell subjected to an ADD test that is longer than either the first or second shorter-term ADD tests.

Accordingly, the Rdc growth rate angle for a third cell is approximated using the following steps:

1. The second shorter-term ADD test data (second cell) is offset to align it with the first shorter-term ADD test voltage drop (first cell) corresponding to the beginning of the third region.

2. The data is shifted to the left such that the beginning of the third region point is at 0% DoD for both the first and second shorter-term ADD test data readings. This allows the intercept to be fixed at the offset value determined in step 1.

3. If there is no test data out to 90% DoD for the second shorter-term test (second cell), the function $(f(x)=a+bx^3)$ is used to fit the DoD/voltage drop relationship for the first shorter-term ADD test data (first cell) to extend the second shorter-term test data points to approximately 90% DoD.

4. The slope (m) from the 0% DoD point (coinciding to the shifted intercept of the beginning of the third region for the first and second cells) to each 2% DoD point on both the first and second shorter-term ADD test data curves is next calculated. The number of slope lines to be generated for each of the two tests is calculated by subtracting the beginning of the third region DoD point from 90% DoD and dividing the result by 2.

5. For each line segment corresponding to the successive 2% DoD points, the rotation angle between the first and second shorter-term ADD test slopes is computed using the equation: $\tan \theta = (m_2 - m_1)/(1 + m_2 m_1)$.

6. The longer-term ADD test data of the third cell is offset to align the beginning of its third region with the intercept of the first and second shorter-term ADD test data readings at the beginning of the third regions. The third cell is similar to the first and second cells in its chemistry and construction.

7. The rotation angles at each 2% DoD between the first and second shorter-term ADD test curves are now used to estimate the tail of the third cell undergoing a longer ADD test regime by sweeping the tangent calculations from step 5 into slope alignment with the longer-term ADD test data as an estimation of what the remaining portion of the discharge curve for the third cell will look like out to 90% DoD.

Figure 2:
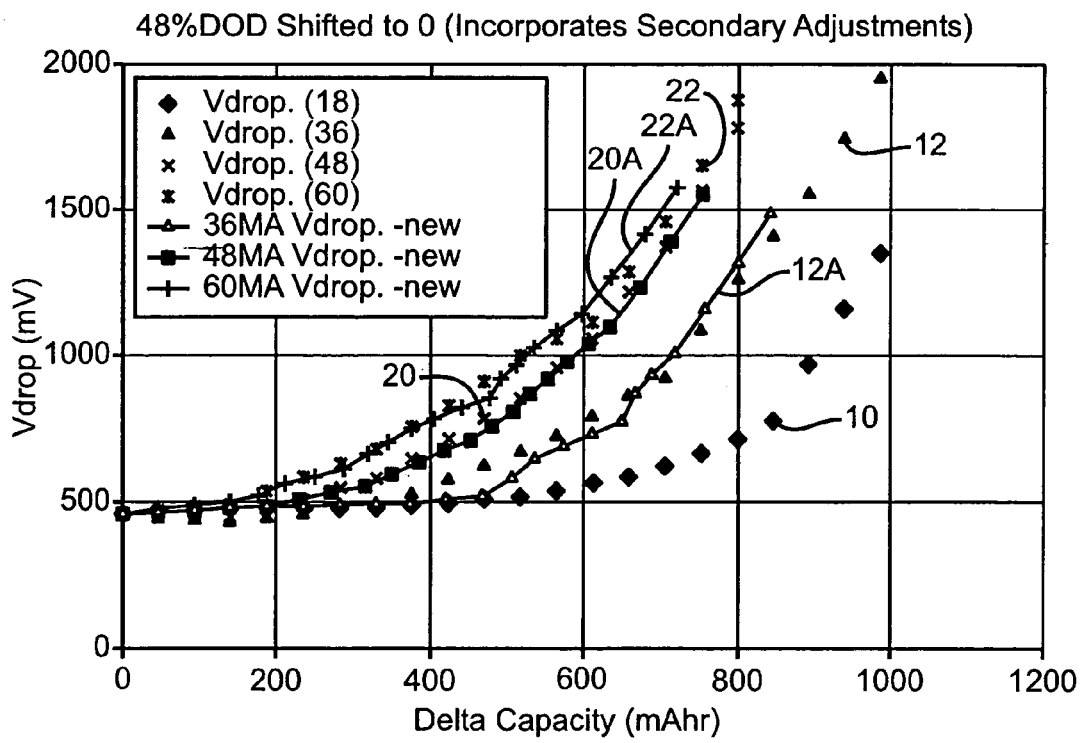
FIG. 2 is a graph of the tails for two additional Li/SVO cells discharged under 48-month and 60-month ADD regimes and estimated from the discharge curves shown in FIG. 1 and then re-plotted based on the secondary adjustment parameters illustrated in FIG. 3.

An example of the above-described method is illustrated in FIGS. 1 and 2. FIG. 1 is a graph constructed from the voltage drop data of two similarly constructed Li/SVO cells. The curve labeled 10 is from a cell discharged under an 18-month ADD test (first shorter-term ADD test) while the curve labeled 12 was constructed from a 36-month ADD test (second shorter-term ADD test) cell. The second shorter-term ADD test data (second cell) has been offset to align it with the first shorter-term ADD test voltage drop (first cell) corresponding to the beginning of the third region. Since the cathodes are of a freestanding SVO sheet, the beginning of the third region for each cell is matched at 48% DoD (the approximate beginning of the third region) and re-aligned or shifted to 0% DoD, which is indicated at 14. Since the cell subjected to the second shorter-term ADD test was not fully discharged to 90% DoD, the last data reading on the 36-month ADD curve is indicated at 16. The function $(f(x)=a+bx^3)$ is then used to extend the DoD/voltage drop relationship for the 36-month ADD curve to 90% DoD and this portion of the discharge curve is indicated at 18. Had the second cell been fully discharged to 90% DoD, this step would not be necessary. The slopes for both the 18-month ADD test and the 36-month ADD test curves are then calculated from 48% DoD (shifted to 0% DoD) to 90% DoD at 2% DoD increments. The result is the generation of 21 slope lines (90% DoD–48% DoD/2) for each test regime. The rotational angle between the 18-month ADD test slope lines and the 36-month ADD test slope lines is computed using the equation: $\tan \theta = (m_2 - m_1)/(1 + m_2 \, m_1)$.

Referring now to FIG. 2, the calculated rotational angles between the tails of both the first and second shorter-term ADD tests at each 2% DoD are now usable as an estimation of what the tails of other cells undergoing longer-term ADD tests will look like. In other words, the tail rotation estimation for the 36-month ADD test data is now usable to compute the estimated tail for a similarly constructed cell subjected to a third, longer ADD test protocol. While the third cell is typically one undergoing a longer-term ADD test, that should not be seen as limiting the scope of the invention. The third test protocol can be of a TToT that is less than the shorter-term ADD test, greater than the longer-term test or of a TToT between them. The discharge curves indicated as 20 and 22 are for Li/SVO cells subjected to 48-month and 60-month ADD tests, respectively.

Figure 3:
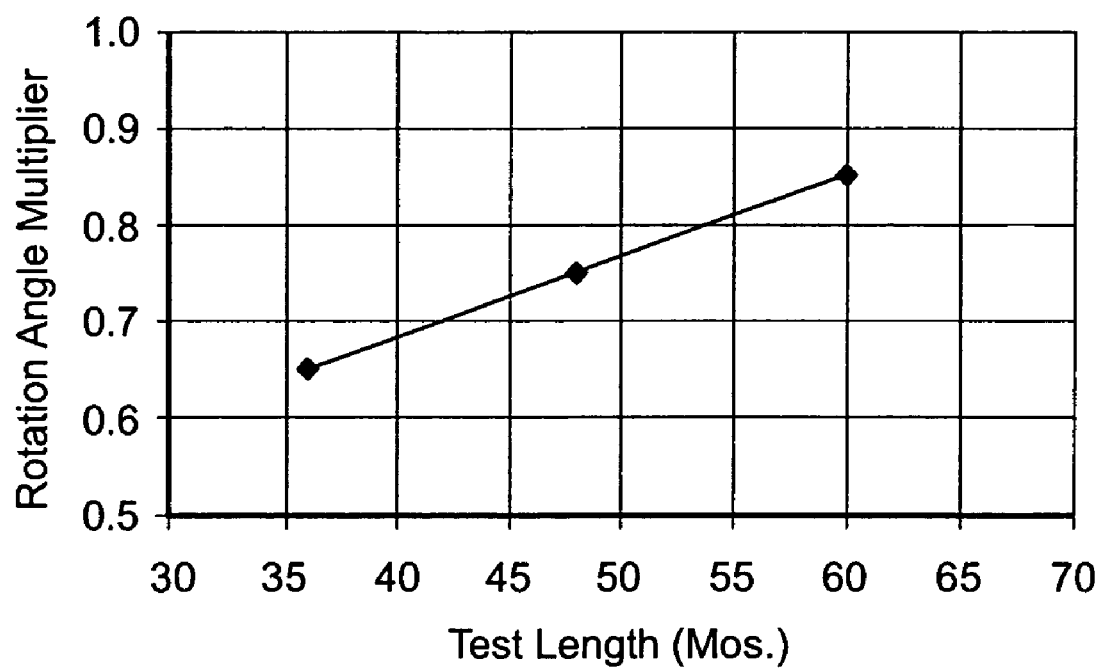
FIG. 3 is a graph of secondary adjustments applied to the 48-month and 60-month estimated discharge curves shown in FIG. 2.

From empirical data it is known that the computed angles from step 5 above over-rotate the data points. Therefore, a secondary adjustment factor as a function of test length is applied. The graph in FIG. 3 and the chart of Table 2 illustrate these secondary factors for ADD test lengths of 36 to 60 months. These secondary factors are then applied to the discharge curves 12, 20 and 22 in FIG. 2 to arrive at the adjusted curves labeled 12A, 20A and 22A in that graph.

TABLE 2

| Test Length | Adj. Factor |
| --- | --- |
| 36 | 0.65 |
| 48 | 0.75 |
| 60 | 0.85 |

In a broader sense, the present method should not be limited to calculating the slope of the first and second cells at 2% DoD interval. Instead, the slope for each discharge curve can be calculated at intervals from about 0.1% DoD to about 5% DoD. The smaller the interval, the higher the confidence level is in the results. Also, it is not necessary to shift the data readings corresponding to the beginning of the coincident third regions for the first, second and third cells to 0% DoD. This is merely for convenience of presentation. If desired, the respective slope measurements can be done from an un-shifted coincident point.

Individual patients will required an implantable device to assist them based on their unique needs. This means that the power source may last longer for one patient than another. Regardless, it has now been shown that the present method provides a reliable means for predicting when an implantable cell is reaching its end-of-life so that an elective surgery can be scheduled and safely performed. However, while the method has been described primarily with respect to a Li/SVO cell, that should not be seen as limiting. Those skilled in the art will understand that the method is useful with a myriad of cell chemistries. The only criteria are that there be three cells of similar chemistries that are subjected to different discharge regimes. Then, the discharge curve of the third cell typically being subjected to the longest discharge regime can be predicted based on data gathered from the other two.

It is appreciated that various modifications to the present inventive concepts described herein may be apparent to those of ordinary skill in the art without departing from the spirit and scope of the present invention as defined by the herein appended claims.

What is claimed is:

1. A method for estimating the discharge curve of an electrochemical cell, comprising the steps of:
    a) subjecting a first cell to a first shorter-term accelerated discharge test having a shortest total time on test, thereby generating a first discharge curve;
    b) subjecting a second cell to a second shorter-term accelerated discharge test having a longer total time on test than the first cell, thereby generating a second discharge curve;
    c) subjecting a third cell to a longer-term accelerated discharge test having a longer total time on test than either the first or second cells, thereby generating a third discharge curve, wherein the first, second and third cells are of a similar chemistry and construction;
    d) offsetting the second and third discharge curves so that they intercept with the first discharge curve at a pre-determined similar percent depth-of-discharge;
    e) calculating a first and second series of slopes for the first and second cells, respectively, from the intercept to an end percent depth-of-discharge at incremental depths-of-discharge;
    f) calculating a rotational angle between the first and second series of slopes at each incremental depth-of-discharge;
    g) utilizing the rotational angles from step f) to estimate the third discharge curve from the intercept point to the end percent depth-of-discharge to determine when the third cell is reaching its end of life; and
    h) replacing the third cell with a fresh cell prior to the third cell reaching its end of life.

2. The method of claim 1 wherein the incremental depth-of-discharge is from about 0.1% depth-of-discharge to about 5% depth-of-discharge.

3. The method of claim 1 wherein the rotational angle between the first and second series of slopes at each incremental depth-of-discharge is calculated from the equation:

$$\tan \theta = (m_2 - m_1)/(1 + m_2 m_1).$$

4. The method of claim 1 wherein the first, second and third cells are of a lithium/silver vanadium oxide chemistry and the pre-determined similar percent depth-of-discharge is where the leading edge potential of a pulse is coincident with an end edge potential of the pulse.

5. The method of claim 4 wherein the pre-determined similar percent depth-of-discharge is at about 45% depth-of-discharge for a freestanding silver vanadium oxide sheet cathode and at about 70% depth-of-discharge for a pressed powder silver vanadium oxide sheet cathode.

6. The method of claim 1 wherein if the second cell has not been discharged to the end percent depth-of-discharge, using the function $(f(x)=a+bx^3)$ to estimate the second discharge curve from the intercept percent depth-of-discharge to the end percent depth-of-discharge.

7. The method of claim 1 including selecting the end percent depth-of-discharge as about 90% depth-of-discharge.

8. The method of claim 1 including re-aligning the intercept percent depth-of-discharge for the first, second and third cells to 0% depth-of-discharge prior to calculating the first and second series of slopes.

9. The method of claim 1 including providing the first, second and third cells comprising a cathode of an active material selected from the group consisting of copper silver vanadium oxide, manganese dioxide, titanium disulfide, copper oxide, copper sulfide, iron sulfide, iron disulfide, cobalt oxide, nickel oxide, copper vanadium oxide, $LiNiO_2$, $LiMn_2O_4$, $LiCoO_2$, $LiCo_{0.92}Sn_{0.08}O_2$, $LiCO_{1-x}N_xO_2$, and combinations thereof.

10. The method of claim 1 including selecting the accelerated discharge test for the first, second and third cells from the group consisting of 1-year ADD, 3-year ADD, 5-year ADD, 18-month ADD, 36-month ADD, 48-month ADD, and 60-month ADD.

11. The method of claim 1 including providing the accelerated discharge tests having a total time on test selected from the group consisting of 18 months, 36 months, 48 months, 52 months, 60 months, and 85 months.

12. The method of claim 1 including applying an adjustment factor of either 0.65, 0.75 and 0.85 to a discharge curve generated from an accelerated discharge test having a total time on test of about 36 months, 48 months and 60 months, respectively.

13. The method of claim 1 including discharging the first, second and third cell at either 37° C. or 50° C.

14. A method for estimating the discharge curve of an electrochemical cell, comprising the steps of:
    a) subjecting a first cell to a first shorter-term accelerated discharge test having a shortest total time on test, thereby generating a first discharge curve;
    b) subjecting a second cell to a second shorter-term accelerated discharge test having a longer total time on test than the first cell, thereby generating a second discharge curve;
    c) subjecting a third cell to a longer-term accelerated discharge test having a longer total time on test than either the first or second cells, thereby generating a third discharge curve, wherein the first, second and third cells are of a similar chemistry and construction;
    d) offsetting the second and third discharge curves so that they intercept with the first discharge curve at a pre-determined similar percent depth-of-discharge;
    e) shifting the intercept percent depth-of-discharge for the first, second and third cells to 0% depth-of-discharge;
    f) calculating a first and second series of slopes for the first and second cells, respectively, from the shifted intercept to an end percent depth-of-discharge at incremental depths-of-discharge;
    g) calculating a rotational angle between the first and second series of slopes at each incremental depth-of-discharge;
    h) utilizing the rotational angles from step g) to estimate the third discharge curve from the shifted intercept point to the end percent depth-of-discharge. to determine when the third cell is reaching its end of life; and
    i) replacing the third cell with a fresh cell prior to the third cell reaching its end of life.

15. A method for estimating when an electrochemical cell powering an implantable medical device will need to be replaced, comprising the steps of:
   a) subjecting a first cell to a first shorter-term accelerated discharge test having a shortest total time on test, thereby generating a first discharge curve;
   b) subjecting a second cell to a second shorter-term accelerated discharge test having a longer total time on test than the first cell, thereby generating a second discharge curve;
   c) subjecting a third cell to a longer-term accelerated discharge test having a longer total time on test than either the first or second cells, thereby generating a third discharge curve, wherein the first, second and third cells are of a similar chemistry and construction;
   d) intercepting the first discharge curve with the second discharge curve at a pre-determined similar percent depth-of-discharge;
   e) calculating a first and second series of slopes for the first and second cells, respectively, from the intercept to an end percent depth-of-discharge at incremental depths-of-discharge;
   f) calculating a rotational angle between the first and second series of slopes at each incremental depth-of-discharge;
   g) utilizing the rotational angles from step f) to estimate a remaining portion of the third discharge curve past its intercept with the first and second discharge curves to the end percent depth-of-discharge thereby determining when the medical device will need to be replaced based on actual usage in a patient being similar to one of the first, second and third discharge curves; and
   h) replacing the medical device with a new one including a fresh cell prior to the third cell reaching its end of life.

* * * * *